US012058865B2

United States Patent
Zhang et al.

(10) Patent No.: US 12,058,865 B2
(45) Date of Patent: Aug. 6, 2024

(54) THREE-DIMENSIONAL MEMORY DEVICES WITH SUPPORT STRUCTURES AND METHODS FOR FORMING THE SAME

(71) Applicant: YANGTZE MEMORY TECHNOLOGIES CO., LTD., Wuhan (CN)

(72) Inventors: Zhong Zhang, Wuhan (CN); Yuhui Han, Wuhan (CN); Wenxi Zhou, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 785 days.

(21) Appl. No.: 17/117,714

(22) Filed: Dec. 10, 2020

(65) Prior Publication Data

US 2022/0157846 A1    May 19, 2022

Related U.S. Application Data

(63) Continuation of application No. PCT/CN2020/128553, filed on Nov. 13, 2020.

(51) Int. Cl.
| | |
|---|---|
| *H10B 41/27* | (2023.01) |
| *H01L 23/00* | (2006.01) |
| *H10B 41/50* | (2023.01) |
| *H10B 43/27* | (2023.01) |
| *H10B 43/50* | (2023.01) |

(52) U.S. Cl.
CPC .......... *H10B 43/50* (2023.02); *H01L 23/562* (2013.01); *H10B 41/27* (2023.02); *H10B 41/50* (2023.02); *H10B 43/27* (2023.02)

(58) Field of Classification Search
CPC ........ H10B 43/35; H10B 41/35; H10B 41/20; H10B 43/00–50; H10B 41/00–70
See application file for complete search history.

(56) References Cited

U.S. PATENT DOCUMENTS

| | | | |
|---|---|---|---|
| 9,412,749 B1 | 9/2016 | Shimabukuro et al. | |
| 9,853,038 B1 | 12/2017 | Cui | |
| 9,881,929 B1* | 1/2018 | Ravikirthi | ............. H10B 43/27 |
| 2017/0287926 A1* | 10/2017 | Ariyoshi | ........... H01L 29/41741 |
| 2018/0130812 A1* | 5/2018 | Hosoda | .................. H10B 43/27 |

FOREIGN PATENT DOCUMENTS

| | | |
|---|---|---|
| CN | 110911413 A | 3/2020 |
| CN | 111554685 A | 8/2020 |
| TW | 201807807 A | 3/2018 |
| TW | 201901933 A | 1/2019 |

OTHER PUBLICATIONS

International Search Report issued in corresponding International Application No. PCT/CN2020/128553, mailed Aug. 13, 2021, 4 pages.

* cited by examiner

*Primary Examiner* — Eric K Ashbahian
*Assistant Examiner* — Halee Cramer
(74) *Attorney, Agent, or Firm* — BAYES PLLC

(57) ABSTRACT

A 3D memory device includes a memory stack and a support structure. The memory stack, on a substrate, includes a core region and a non-core region neighboring the core region. The support structure extends in the non-core region and into the substrate. The support structure includes a first support portion and a second support portion over the first support portion. The first support portion has a stiffness higher than the second support portion.

17 Claims, 9 Drawing Sheets

THREE-DIMENSIONAL MEMORY DEVICES WITH SUPPORT STRUCTURES AND METHODS FOR FORMING THE SAME

CROSS-REFERENCE TO RELATED APPLICATIONS

This application is continuation of International Application No. PCT/CN2020/128553, filed on Nov. 13, 2020, entitled "THREE-DIMENSIONAL MEMORY DEVICES WITH SUPPORT STRUCTURES AND METHODS FOR FORMING THE SAME," which is hereby incorporated by reference in its entirety.

BACKGROUND

The present disclosure relates to three-dimensional (3D) memory devices having source structures of reduced resistance and improved support, and methods for forming the 3D memory devices.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. 3D memory architecture includes a memory array and peripheral devices for controlling signals to and from the memory array.

SUMMARY

Embodiments of 3D memory devices with support structures and methods for forming the 3D memory devices are provided.

In one example, a 3D memory device includes a memory stack and a support structure. The memory stack, on a substrate, includes a core region and a non-core region neighboring the core region. The support structure extends in the non-core region and into the substrate. The support structure includes a first support portion and a second support portion over the first support portion. The first support portion has a stiffness higher than the second support portion.

In another example, a method for forming a 3D memory device includes forming a channel sacrificial portion and a first support portion in a first dielectric stack portion over a substrate, forming a second dielectric stack portion over the first dielectric stack portion, forming a channel structure in the first and second dielectric stack portions from the channel sacrificial portion, and forming a second support portion over the first support portion to form a support structure.

In a further example, a method for forming a 3D memory device includes forming a first dielectric stack portion over a substrate, the first dielectric stack portion comprising interleaved a first plurality of dielectric layers and a first plurality of sacrificial layers, and forming, in a same process, a plurality of channel sacrificial portions in a core region, at least one first support portion in a transitional region, and at least one other first support portion in a staircase region, of the first dielectric stack portion. The method also includes forming a second dielectric stack portion over the first dielectric stack portion, the second dielectric stack portion having interleaved a second plurality of dielectric layers and a second plurality of sacrificial layers. The method further includes forming a plurality of channel structures in the first and second dielectric stack portions from the plurality of channel sacrificial portions, and forming, in a same process, at least one second support portion over the first support portions and at least one other second support portion over the at least one other first support portion.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
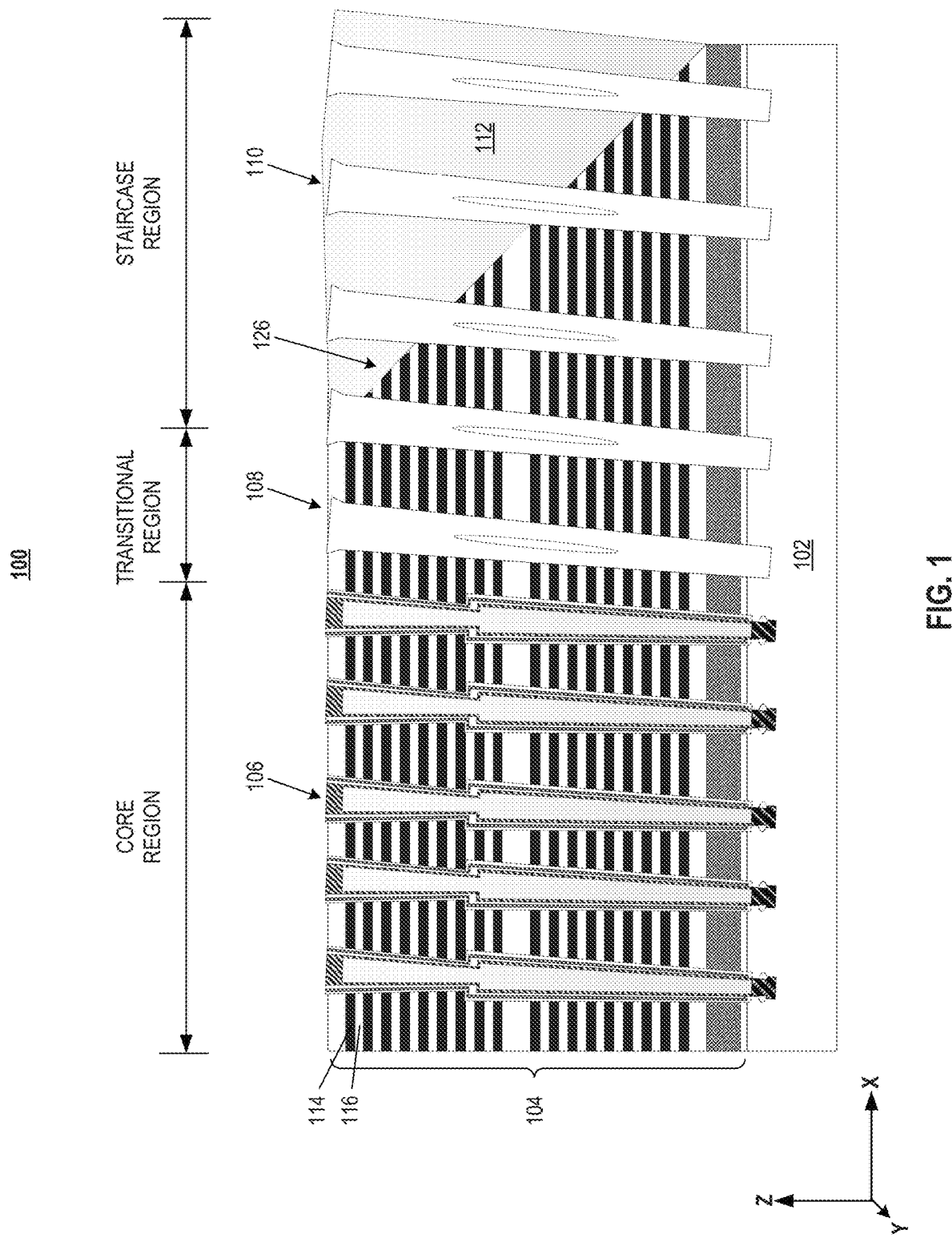
FIG. 1 illustrates a cross-sectional view of an existing 3D memory device with deformed support structures.

Embodiments of the present disclosure will be described with reference to the accompanying drawings.

DETAILED DESCRIPTION

Although specific configurations and arrangements are discussed, this should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, a staircase structure refers to a set of surfaces that include at least two horizontal surfaces (e.g., along x-y plane) and at least two (e.g., first and second) vertical surfaces (e.g., along z-direction) such that each horizontal surface is adjoined to a first vertical surface that extends upward from a first edge of the horizontal surface, and is adjoined to a second vertical surface that extends downward from a second edge of the horizontal surface. A "step" or "staircase" refers to a vertical shift in the height of a set of adjoined surfaces. In the present disclosure, the term "staircase" and the term "step" refer to one level of a staircase structure and are used interchangeably. In the present disclosure, a horizontal direction can refer to a direction (e.g., the x-direction or the y-direction) parallel with the top surface of the substrate (e.g., the substrate that provides the fabrication platform for the formation of structures over it), and a vertical direction can refer to a direction (e.g., the z-direction) perpendicular to the top surface of the structure.

NAND flash memory devices, widely used in various electronic products, are non-volatile, light-weighted, of low power consumption and good performance. Currently, planar NAND flash memory devices have reached its storage limit. To further increase the storage capacity and reduce the storage cost per bit, 3D NAND memory devices have been proposed. An existing 3D NAND memory device often includes a number of levels (or conductor/dielectric layer pairs) and a plurality of channel structures. The conductor layers function as word lines, which are conductively connected to a peripheral circuit through word line contacts. Memory cells are formed at the intersections of channel structures and conductor layers. As the number of levels increases for higher storage, more stress is introduced into the 3D NAND memory device due to the weight and distribution of the conductor layers, causing existing support structures to deform, e.g., tilt. Sometimes, even the channel structures are deformed due to the stress. The deformation of the support structures can cause alignment issues in the fabrication of word line contacts in a staircase region of the 3D NAND memory device, resulting in yield loss.

FIG. 1 illustrates a cross-sectional view of a 3D NAND memory device with deformed support structures and deformed channel structures. The 3D NAND memory device 100 includes a core region, a transitional region, and a staircase region. The 3D NAND memory device 100 includes a memory stack 104, an insulating structure 112 over memory stack 104, and a substrate 102 on which memory stack 104 and insulating structure 112 are located. Memory stack 104 includes a plurality interleaving conductor layers 114 and dielectric layers 116, forming a plurality of conductor/dielectric layer pairs (e.g., levels). In the core region, 3D NAND memory device 100 includes a plurality of channel structures 106 extending in memory stack 104. In the staircase region, 3D NAND memory device 100 includes a plurality stairs 126, on which word line contacts (not shown) are formed and in contact with respective conductor layers 114. In the transitional region and the staircase region, a plurality of support structures 108 and 110 (e.g., also known as dummy channels) respectively extend in 3D NAND memory device 100, providing support to 3D NAND memory device 100 such that stress caused by the weight and distribution of conductor/dielectric layer pairs (e.g., conductor layers 114) can be balanced.

The stress-bearing performance of support structures 108 and 110 is often largely determined by the material(s) of support structures 108 and 110. Support structures 108 and 110 can be made of a dielectric material, such as silicon oxide. The stiffness and mechanical strength of silicon oxide are relatively low. Because conductor layers 114 often include a conductor material (e.g., tungsten) that is considerably heavy, stress on support structures 108 and 110 can often increase as the number of levels increases in 3D NAND memory device 100. The increased stress may cause the support structures 108 and 110 to deform (e.g., tilt from their purported orientation) as shown in FIG. 1. For example, support structures 108 and 110 may deviate from the vertical direction (e.g., the z-direction). The deformed support structures 108 and 110 can further cause part of conductor/dielectric layer pairs in the transitional region and/or staircase region to deform, e.g., sink towards substrate 102. Sometimes, even channel structures 106 can deform/tilt due to the deformation of 3D NAND memory device 100. The deformation can cause conductor layers 114 in the staircase region to deviate from their purported positions, making it more difficult to align each word line contact with the respective conductor layer 114. Significant deformations can cause yield loss in 3D NAND memory device 100.

The present disclosure provides 3D memory devices (e.g., 3D NAND memory devices) having support structures with improved stress-bearing performance. The support structures are formed in at least part of the staircase region of a 3D memory device. In some embodiments, the support structures can also be formed in the transitional region. Compared to conventional support structures, a disclosed support structure has a first support portion of a first material, and a second support portion of a second material and over the first support portion. The stiffness and mechanical strength of the first material are higher than the second material. In some embodiments, the first material includes polysilicon, and the second material includes silicon oxide. In some embodiments, the second support portion is on the first support portion. In some embodiments, the second support portion is on and laterally surrounds the first support portion. The structure and materials of the disclosed support structure provide improved stress-bearing performance, e.g., higher stiffness, mechanical strength, and stability, in the 3D memory device, and are thus less susceptible to deformation. Improve support can be provided to conductor/dielectric layer pairs in 3D NAND memory device. Accordingly, the conductor/dielectric layer pairs in the 3D memory device are less susceptible to deformation. Impact on the alignment of word line contacts, as the number of levels increases, can be reduced. Yield loss of the 3D memory device can also be reduced.

The fabrication process of the disclosed support structure is compatible with other fabrication process flow. In some embodiments, no additional fabrication steps is needed, compared with existing/other fabrication processes. In some embodiments, the first material, which is in the first portion of a support structure, is the same material used to form a sacrificial channel structure. The first material in the first portion of a support structure and in a sacrificial channel structures can be deposited with the same deposition process.

Figure 2:
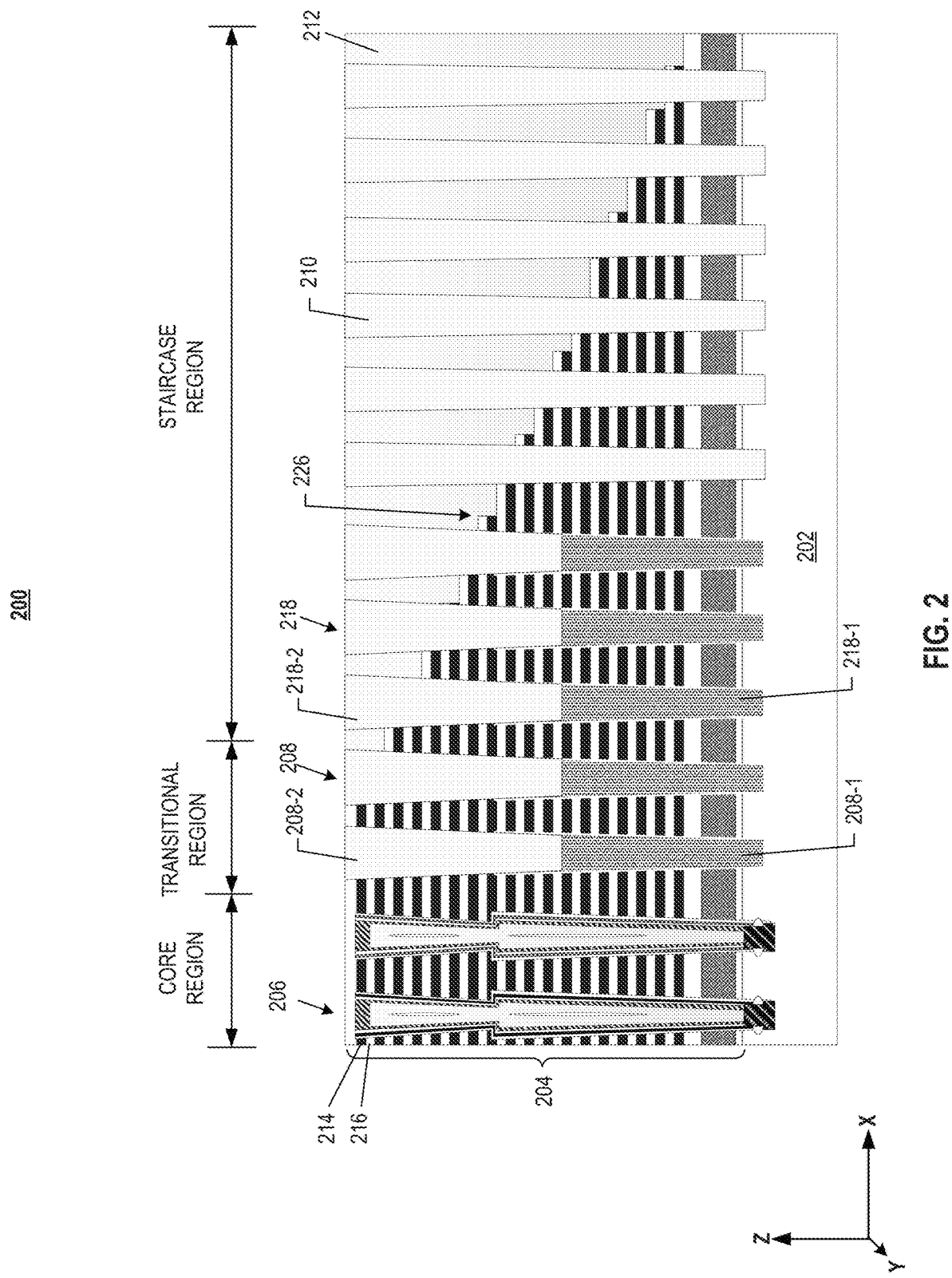
FIG. 2 illustrates a cross-sectional view of an exemplary 3D memory device having support structures with improved stress-bearing performance, according to some embodiments of the present disclosure.

FIG. 2 illustrates a cross-sectional view of a 3D memory device 200 with support structures, according to embodiments of the present disclosure. As shown in FIG. 2, 3D memory device 200 includes a substrate 202, a stack structure 204 over substrate 202, and an insulating structure 212 over stack structure 204 such that stack structure 204 is located in insulating structure 212. Stack structure 204 may include a plurality of conductor layers 214 and a plurality of dielectric layers 216 interleaved with each other, forming a plurality of conductor/dielectric layer pairs. 3D memory device 200 may include a core region, a transitional region neighboring the core region, and a staircase region neighboring the transitional region. The staircase region and the transitional region may be collectively referred as a non-core region. In the core region, 3D memory device 200 may include a plurality of channel structures 206 extending through stack structure 204 into substrate 202 along a vertical direction (e.g., the z-direction). In the transitional region, 3D memory device 200 may include a plurality of first support structure 208 extending through stack structure 204 along the vertical direction. In the staircase region, stack structure 204 may include a staircase structure having a plurality of stairs 226 on which word line contacts (not shown) are landed. 3D memory device 200 may include a plurality of second support structures 218 and third support structures 210 extending in the staircase structure. In some embodiments, stack structure 204 may be a memory stack in which a plurality of memory cells are formed by the intersections of channel structures 206 and conductor layers 214. The number of the conductor/dielectric layer pairs in stack structure 204 (e.g., 32, 64, 96, or 128) determines the number of memory cells in 3D memory device 200.

Substrate 202 can include silicon (e.g., single crystalline silicon), silicon germanium (SiGe), gallium arsenide (GaAs), germanium (Ge), silicon on insulator (SOI), germanium on insulator (GOI), or any other suitable materials. In some embodiments, substrate 202 is a thinned substrate (e.g., a semiconductor layer), which was thinned by grinding, etching, chemical mechanical polishing (CMP), or any combination thereof. In some embodiments, substrate 202 includes silicon. In some embodiments, substrate 202 includes a semiconductor/doped layer at an upper portion and located at least in the core region. The semiconductor/doped layer may be in contact with the channel structures in the core region and function as part of the source structure of 3D memory device 200.

In the core region, channel structures 206 may each extend vertically above substrate 202 in the core region of 3D memory device 200. Channel structure 206 may have a substantially cylindrical shape and may include a memory film, a semiconductor layer, and in some embodiments, a dielectric core. A semiconductor channel can be formed in the semiconductor layer. In some embodiments, memory film includes dielectric materials, and the semiconductor layer includes semiconductor materials. In some embodiments, the semiconductor layer includes silicon, such as amorphous silicon, polysilicon, or single crystalline silicon. In some embodiments, the memory film is a composite layer including a tunneling layer, a memory layer (also known as a "charge trap layer"), and a blocking layer. Optionally, the remaining space of the channel hole of the semiconductor channel can be partially or fully filled with a dielectric core including dielectric materials, such as silicon oxide. The dielectric core, semiconductor layer, the tunneling layer, the memory layer, and the blocking layer are arranged radially from the center toward the outer surface of the pillar in this order, according to some embodiments. The tunneling layer can include silicon oxide, silicon oxynitride, or any combination thereof. The memory layer can include silicon nitride, silicon oxynitride, silicon, or any combination thereof. The blocking layer can include silicon oxide, silicon oxynitride, high dielectric constant (high-k) dielectrics, or any combination thereof. In one example, the memory layer can include a composite layer of silicon oxide/silicon oxynitride (or silicon nitride)/silicon oxide (ONO).

In some embodiments, channel structure 206 further includes a semiconductor plug (e.g., an epitaxial portion) in the lower portion (e.g., at the lower end) of channel structure 206. As used herein, the "upper end" of a component (e.g., channel structure 206) is the end farther away from substrate 202 in the vertical direction, and the "lower end" of the component (e.g., channel structure 206) is the end closer to substrate 202 in the vertical direction when substrate 202 is positioned in the lowest plane of 3D memory device 200. The semiconductor plug can include a semiconductor material, such as silicon, which is epitaxially grown from substrate 202 or deposited on substrate 202. It is understood that in some embodiments, the epitaxial portion includes single crystalline silicon, the same material as substrate 202. In other words, the semiconductor plug can include an epitaxially-grown semiconductor layer grown from substrate 202. The semiconductor plug can also include a different material than substrate 202. In some embodiments, the epitaxial portion includes at least one of silicon, germanium, and silicon germanium. The semiconductor plug may be conductively connected to the semiconductor channel and may function as part of a source structure of 3D memory device 200.

In some embodiments, channel structure 206 further includes a drain structure (e.g., channel plug) in the upper portion (e.g., at the upper end) of channel structure 206. The drain structure can be in contact with the upper end of the semiconductor channel and may be conductively connected to the semiconductor channel. The drain structure can include semiconductor materials (e.g., polysilicon) or conductive materials (e.g., metals). In some embodiments, the drain structure includes an opening filled with Ti/TiN or Ta/TaN as an adhesion layer and tungsten as a conductor material.

Conductor layers 214 and dielectric layers 216 in stack structure 204 are alternatingly arranged along the vertical direction in 3D memory device 200. Except for the top and bottom conductor layers 214, each conductor layer 214 is adjacent to a pair of dielectric layers 216, and vice versa. For ease of description, as shown in FIG. 2, each dielectric layer 216 and the underlying conductor layer 214 are together referred to as a conductor/dielectric layer pair. Conductor layers 214 can include conductive materials including, but not limited to, tungsten (W), cobalt (Co), copper (Cu), aluminum (Al), polysilicon, doped silicon, silicides, or any combination thereof. Each conductor layer 214 can include a gate electrode (gate line) surrounded by an adhesion layer and a gate dielectric layer. The gate electrode of conductor layer 214 can extend laterally as a word line, ending at the staircase structure. Dielectric layers 216 can include dielectric materials including, but not limited to, silicon oxide, silicon nitride, silicon oxynitride, or any combination thereof.

In the staircase region, stack structure 204 may have a staircase structure, which includes a plurality of stairs 226, e.g., extending laterally along the x/y direction. Each stair 226 may include one or more conductor/dielectric layer pairs. A word line contact (not shown) extending in insulating structure 212 may be in contact with and conductively connected to a top conductor layer 214 of a respective stair 226. The word line contact can include conductive materials including, but not limited to, W, Co, Cu, Al, polysilicon, doped silicon, silicides, or any combination thereof. Insulating structure 212 can include dielectric materials including, but not limited to, silicon oxide, silicon nitride, silicon oxynitride, or any combination thereof.

As shown in FIG. 2, a plurality of first support structures 208 can be formed in the transitional region, between the core region and the staircase region of 3D memory device 200. First support structures 208 may extend vertically (e.g., along the z-direction) in stack structure 204, providing support to conductor layers 214 and dielectric layers 216. First support structure 208 may or may not be in contact with substrate 202 In some embodiments, first support structure 208 extends from an upper surface of stack structure 204 to an upper surface of substrate 202. In some embodiments, a lower surface of first support structure 208 is below the upper surface of stack structure 204.

First support structure may have a cylindrical shape (e.g., pillar shape) and may be filled with non-conductive (e.g., dielectric) materials having desirable stiffness and mechanical strength. The stiffness of object is the extent to which the object resists deformation in response to an applied force. Stiffness can be the ratio of the applied force over the displacement produced by the applied force. Stiffness can be measured in newtons per meter (N/m) and pounds (lbs) per inch. In the same unit, an object with a greater/higher stiffness has a higher value than an object with a less/lower stiffness. First support structure 208 includes a first support portion 208-1 and a second support portion 208-2, which may be on and in contact with first support portion 208-1. In some embodiments, as shown in FIG. 2, second support portion 208-2 has no lateral contact (e.g., along the x-direction or y-direction) with first support portion 208-1. In some embodiments, first support portion 208-1 is located at the lower portion, and second support portion 208-2 is located at the upper portion. The contacting interface of first and second support portions 208-1 and 208-2 may be at least substantially flat/horizontal. That is, the lower surface of second support portion 208-2 is in contact with the upper surface of first support portion 208-1. In the plurality of first support structures 208, the interfaces may be substantially coplanar with one another.

First support portion 208-1 may be filled with a first material, and second support portion 208-2 may be filled with a second material. The first and second materials may be different from each other. In some embodiments, the stiffness and/or mechanical strength of the first material is higher than the second material. In some embodiments, the first material includes polysilicon, and the second material includes silicon oxide. It should be noted that, in various embodiments, the first and second materials may each include other (e.g., one or more) suitable non-conductive materials such as carbon, silicon oxynitride, or a combination thereof.

Optionally, a plurality of second support structures 218, neighboring first support structures 208, may be formed in the staircase region. Second support structures 218 may, along the vertical direction, extend in insulating structure 212 and the staircase structure. The lower surface of second support structure 218 may be in contact with and/or below the upper surface of substrate 202. Second support structure 218 may include a first support portion 218-1 and a second support portion 218-2 in contact with and on first support portion 218-1. In some embodiments, first support portion 218-1 has the same material as first support portion 208-1. In some embodiments, second support portion 218-2 has the same material as second support portion 208-2. In some embodiments, the interface between second support portion 218-2 and first support portion 218-1 may be coplanar with the interface between second support portion 208-2 and first support portion 208-1. In some embodiments, the lower surfaces of first support portions 208-1 and 218-1 may be coplanar with each other. In some embodiments, second support portion 218-2 extends partially in insulating structure 212, and the interface between first support portion 218-1 and second support portion 218-2 may be below the upper surface of the staircase structure (e.g., the upper surfaces of stairs 226).

A plurality of third support structures 210, neighboring second support structures 218, may be formed in the staircase region. In some embodiments, third support structures 210 are located further away from first support structures 208, compared to second support structures 218. That is, second support structures 218 may be between first support structures 208 and third support structures 210. Third support structures 210 may, along the vertical direction, extend in insulating structure 212 and the staircase structure. The lower surface of third support structure 210 may be in contact with and/or below the upper surface of substrate 202. Different from first and second support structures 208 and 218, third support structure 210 does not have more than one support portion, e.g., includes a single non-conductive material. In some embodiments, third support structure 210 includes the same material as the second material, e.g., silicon oxide. In various embodiments, third support structure 210 includes a different material than the second material.

In various embodiments, first support structures 208, second support structures 218, and third support structures 210 may have the same shape and dimensions or may have different shapes and/or dimensions. In some embodiments, first and second support structures 208 and 218 may have the same shapes and dimensions. In some embodiments, first support portions 208-1 and 218-1 may have the same shapes, dimensions, and materials. In some embodiments, second support portions 208-2 and 218-2 may have the same shapes, dimensions, and materials.

Figure 3:
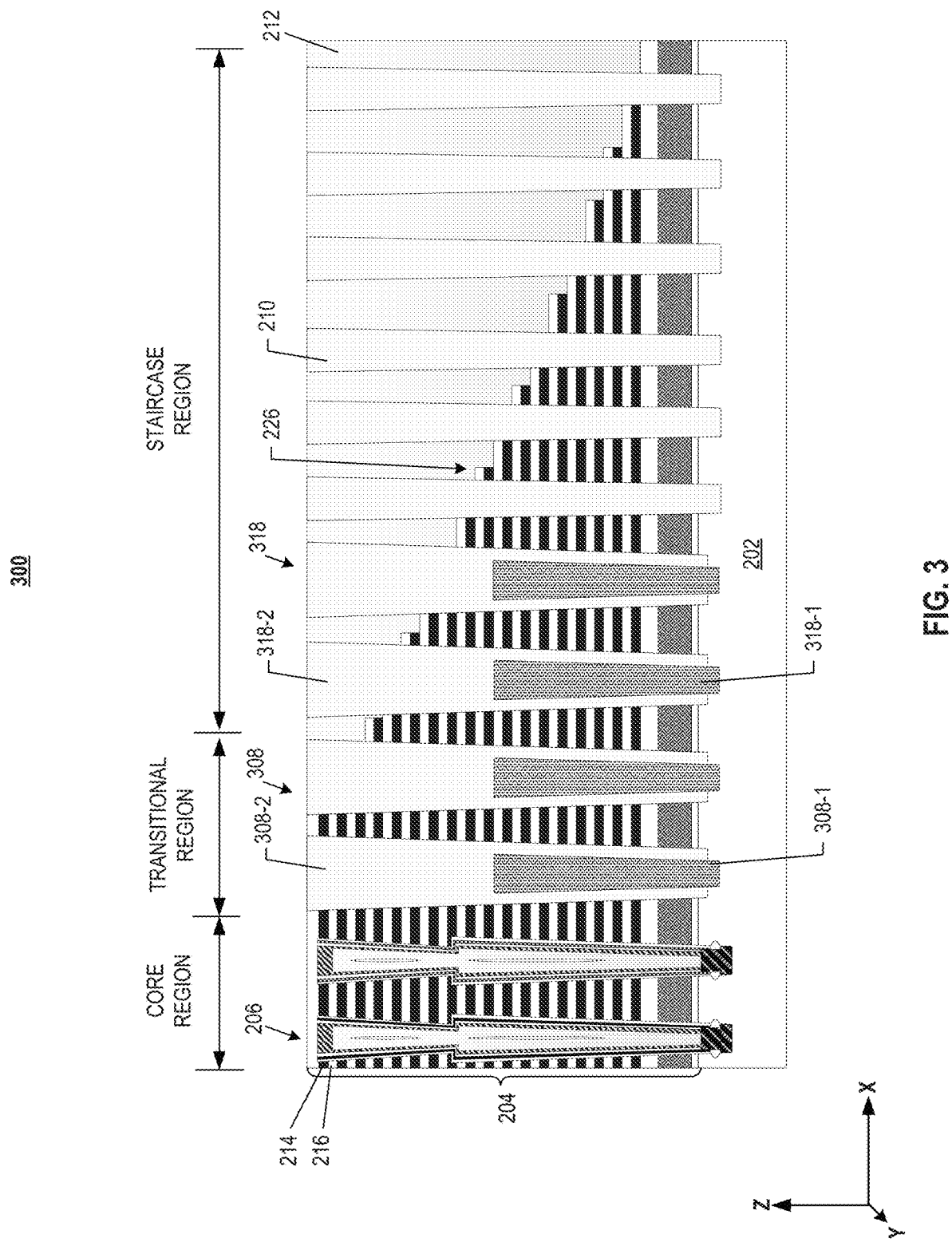
FIG. 3 illustrates a cross-sectional view of another exemplary 3D memory device having support structures with improved stress-bearing performance, according to some embodiments of the present disclosure.

FIG. 3 illustrates a cross-sectional view of a 3D memory device 300 with support structures, according to embodiments of the present disclosure. Different from 3D memory device 200, 3D memory device 300 includes a plurality of first support structures 308 distributed in the transitional region. Optionally, 3D memory device 300 also includes a plurality of second support structures 318 distributed in the staircase region. In some embodiments, second support structures 318 are located between third support structures 210 and first support structures 308. First and second support structures 308 and 318 may each include a first support portion (e.g., 308-1 and 318-1) and a second support portion (e.g., 308-2 and 318-2). Similar to first and second support structures 208 and 218, the first support portion includes a first material, and the second support portion includes a second material. The first material may have higher stiffness and/or mechanical strength than the second material. Detailed description of the first and second materials may be referred to the description of first and second materials in 3D memory device 200 and is not repeated herein.

Different from first and second support structures 208 and 218, first and second support structures 308 and 318 may each have a second support portion (e.g., 308-2 and 318-2) on and laterally in contact (e.g., along various directions in the x-y plane) with respective first support portion (e.g., 308-1 and 318-1). As shown in FIG. 3, second support portion 308-2 and 318-2 may each surround the respective first support portion 308-1 and 318-1, vertically (e.g., on the upper surface of the respective first support portion) and horizontally (e.g., on the side surfaces of the respective first support portion). That is, the lateral dimensions of second support portions 308-2 and 318-2 may each be greater than the respective first support portions 308-1 and 318-1 such that the first support portion can be at least partially surrounded by the respective second support portion along lateral directions. In some embodiments, the second support portion (e.g., 308-2 and 318-2) each fully covers the side surface of the respective first support portion (e.g., 308-1 and 318-1). The bottom surfaces of second support portion 308-2 and 318-2 may or may not be in contact with substrate 202. In some embodiments, the bottom surfaces of second support portion 308-2 and 318-2 extend below the upper surface of substrate 202, and may or may not be coplanar with the bottom surfaces of first support portions 308-1 and 318-2. In some embodiments, the bottom surfaces of second support portion 308-2 and 318-2 are above the bottom surfaces of first support portion 308-1 and 318-1.

Although not depicted in the figures, 3D memory devices 200 and 300 may have a plurality of source contact structures, each having a dielectric spacer and a source contact in the dielectric spacer. The source contact structures may extend in stack structure 204 vertically and laterally and may function as part of the source of the respective 3D memory device. The source contact may include a suitable conductive material such as W, Al, Co, Cu, polysilicon, silicides, or a combination thereof. The dielectric spacer may include a suitable dielectric material such as silicon oxide, silicon nitride, silicon oxynitride, or a combination thereof.

3D memory devices 200 and 300 can each be part of a monolithic 3D memory device. The term "monolithic" means that the components (e.g., the peripheral device and memory array device) of the 3D memory device are formed on a single substrate. For monolithic 3D memory devices, the fabrication encounters additional restrictions due to the convolution of the peripheral device processing and the memory array device processing. For example, the fabrication of the memory array device (e.g., NAND channel structures) is constrained by the thermal budget associated with the peripheral devices that have been formed or to be formed on the same substrate.

Alternatively, 3D memory devices 200 and 300 can each be part of a non-monolithic 3D memory device, in which components (e.g., the peripheral device and memory array device) can be formed separately on different substrates and then bonded, for example, in a face-to-face manner. In some embodiments, the memory array device substrate (e.g., substrate 202) remains as the substrate of the bonded non-monolithic 3D memory device, and the peripheral device (e.g., including any suitable digital, analog, and/or mixed-signal peripheral circuits used for facilitating the operation of 3D memory devices 200 and 300, such as page buffers, decoders, and latches; not shown) is flipped and faces down toward the memory array device (e.g., NAND memory strings) for hybrid bonding. It is understood that in some embodiments, the memory array device substrate (e.g., substrate 202) is flipped and faces down toward the peripheral device (not shown) for hybrid bonding, so that in the bonded non-monolithic 3D memory device, the memory array device is above the peripheral device. The memory array device substrate (e.g., substrate 202) can be a thinned substrate (which is not the substrate of the bonded non-monolithic 3D memory device), and the back-end-of-line (BEOL) interconnects of the non-monolithic 3D memory device can be formed on the backside of the thinned memory array device substrate.

Figure 6:
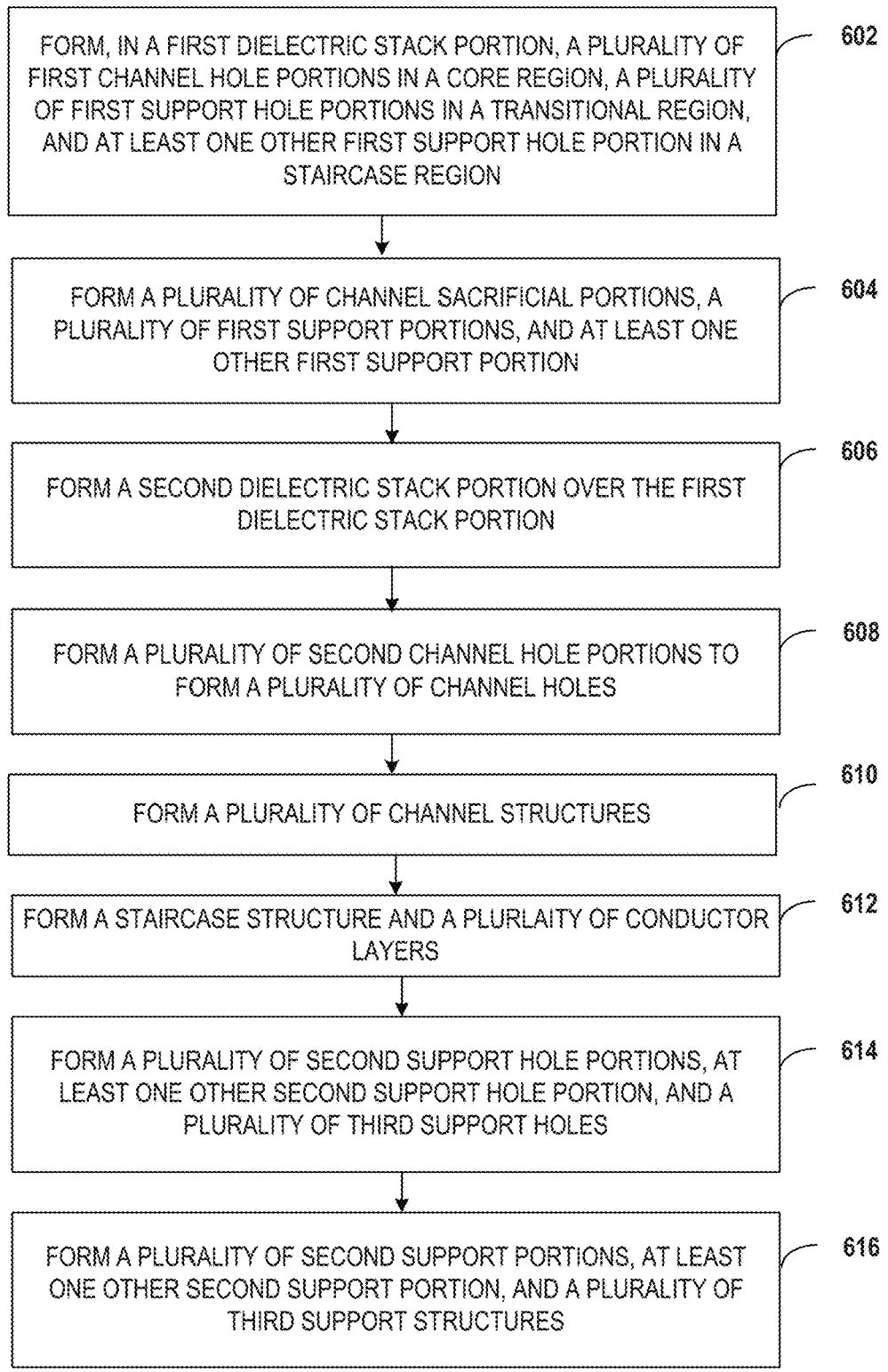
FIG. 6 illustrates a flowchart of an exemplary fabrication process for forming a 3D memory device having support structures of improved stress-bearing performance, according to some embodiments of the present disclosure.

FIGS. 4A-4H illustrate a fabrication process to form a 3D memory device similar to 3D memory device 200, according to some embodiments. FIG. 6 illustrates the flowchart of a method 600 to form the 3D memory device. For ease of illustration, the fabrication process of a 3D memory device having a dual-deck structure is described. In various embodiments, a 3D memory device may be formed by more than two memory decks stack in the vertical direction (e.g., the z-direction). The fabrication of structures in a 3D memory device with more than two memory decks can be similar to the fabrication of the 3D memory device formed in FIGS. 4A-4H, and is not described herein. It is understood that the operations shown in method 600 are not exhaustive and that other operations can be performed as well before, after, or between any of the illustrated operations. Further, some of the operations may be performed simultaneously, or in a different order than shown in FIG. 6.

Figure 4A:
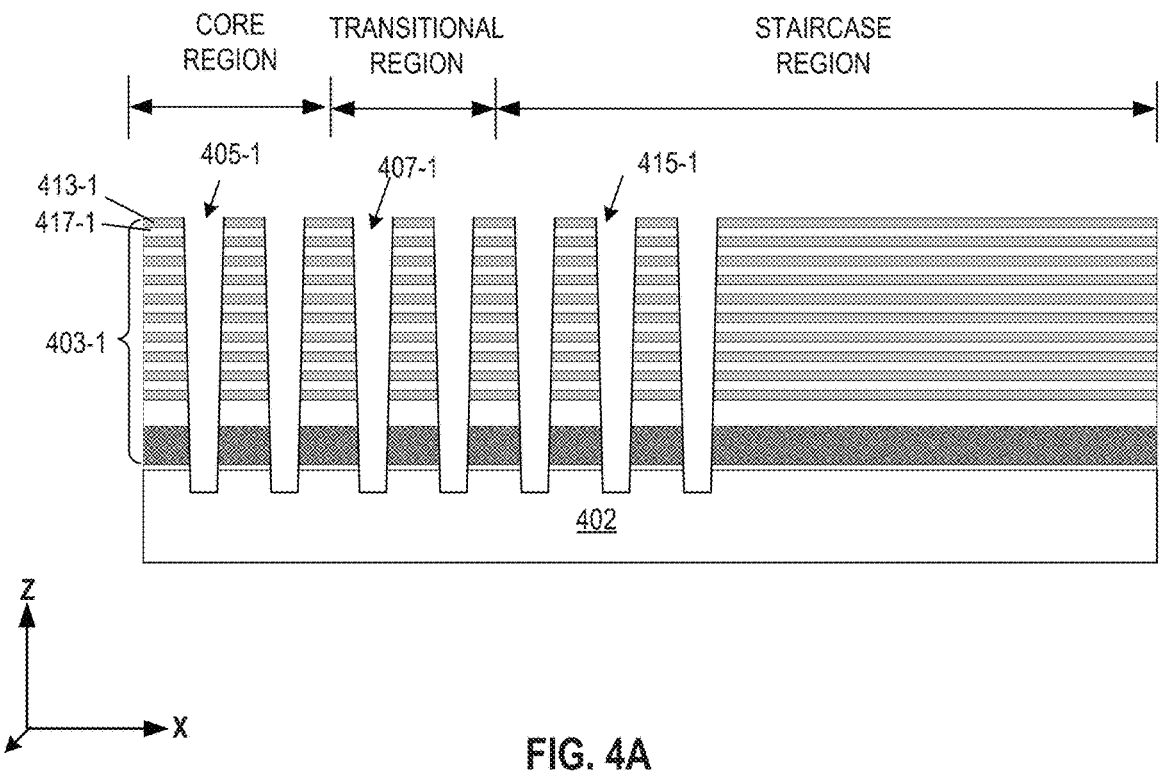
FIGS. 4A-4H illustrate cross-sectional views of a 3D memory device at various stages of an exemplary fabrication process, according to some embodiments of the present disclosure.

At the beginning of the process, at operation 602, in a first dielectric stack portion, a plurality of first channel hole portions are formed in a core region, and a plurality of first support hole portions are formed in a transitional region. Optionally, at least one other first support hole portion is formed in a staircase region. FIG. 4A illustrates a corresponding structure.

As shown in FIG. 4A, in a first dielectric stack portion 403-1, a plurality of first channel hole portions 405-1 are formed in a core region, and a plurality of first support hole portions 407-1 are formed in a transitional region. Optionally, at least one other first support hole portion 415-1 is formed in a staircase region.

First dielectric stack portion 403-1 may be formed over substrate 402. First dielectric stack portion 403-1 may include a plurality of interleaved first sacrificial material layers 413-1 and first dielectric material layers 417-1. First dielectric material layers 417-1 and first sacrificial material layers 413-1 may have different etching selectivities during the subsequent gate-replacement process. In some embodiments, first dielectric material layers 417-1 and first sacrificial material layers 413-1 include different materials. For example, first dielectric material layers 417-1 may include silicon oxide, and first sacrificial material layers 413-1 may include silicon nitride.

The interleaved first sacrificial material layers 413-1 and first dielectric material layers 417-1 can be formed by alternatingly depositing layers of sacrificial material and layers of dielectric material over substrate 402 until a desired number of layers is reached. First sacrificial material layers 413-1 and first dielectric material layers 417-1 can have the same or different thicknesses. In some embodiments, each first dielectric material layer 417-1 and the underlying first sacrificial material layer 413-1 are together referred to as a dielectric pair. In some embodiments, one or more dielectric pairs can form one level/staircase. The deposition of first sacrificial material layers 413-1 and first dielectric material layers 417-1 may each include one or more of chemical vapor deposition (CVD), physical vapor deposition (PVD), and atomic layered deposition (ALD).

A plurality of first channel hole portions 405-1 may be formed extending vertically through first dielectric stack portion 403-1 in the core region of the 3D memory device. In some embodiments, first channel hole portions 405-1 are formed through the interleaved first sacrificial material layers 413-1 and first dielectric material layers 417-1. The plurality of first channel hole portions 405-1 may be formed by performing a suitable etching process, using an etch mask such as a patterned PR layer, to remove portions of first dielectric stack portion 403-1 and expose substrate 402. A recess region may be formed at the bottom of each first channel hole portion 405-1 to expose a top portion of substrate 402, by the same etching process that forms first channel hole portions 405-1 and/or a separate etching process.

A plurality of first support hole portions 407-1 may be formed in the transitional region of the 3D memory device by the same etching process that forms first channel hole portions 405-1. In some embodiments, the same etch mask can be used for the etching process. As shown in FIG. 4A, first support hole portions 407-1 may extend vertically through the interleaved first sacrificial material layers 413-1 and first dielectric material layers 417-1 in the transitional region. In some embodiments, substrate 402 may be exposed at the bottoms of first support hole portions 407-1.

Optionally, a plurality of other first support hole portions 415-1 may be formed in the staircase region of the 3D memory device by the same etching process that forms first channel hole portions 405-1 and first support hole portions 407-1. As shown in FIG. 4A, other first support hole portions 415-1 may extend vertically through the interleaved first sacrificial material layers 413-1 and first dielectric material layers 417-1 in the staircase region. In some embodiments, substrate 402 may be exposed at the bottoms of other first support hole portions 415-1. In some embodiments, the number of other first support hole portions 415-1, if any, is determined based on the subsequently-formed staircase structure (e.g., the height of the stair(s) at the lateral locations of other first support hole portions 415-1). In other words, because the staircase structure is formed after the formation of other first support hole portions 415-1, the upper surface (e.g., coplanar with the upper surface of first dielectric stack portion 403-1) of each other first support hole portion 415-1 needs to be lower than the subsequently-formed stair(s) above the other first support hole portion 415-1. That is, the structure (e.g., height and/or slope) of the subsequently-formed staircase structure may determine the locations and/or the number of other first support hole portions 415-1.

In some embodiments, first channel hole portions 405-1 and first support hole portions 407-1 (and other first support hole portions 415-1, if any) are formed by performing the same etching process, e.g., an anisotropic etching process (e.g., dry etch) and/or an isotropic etching process (wet etch).

Figure 4B:
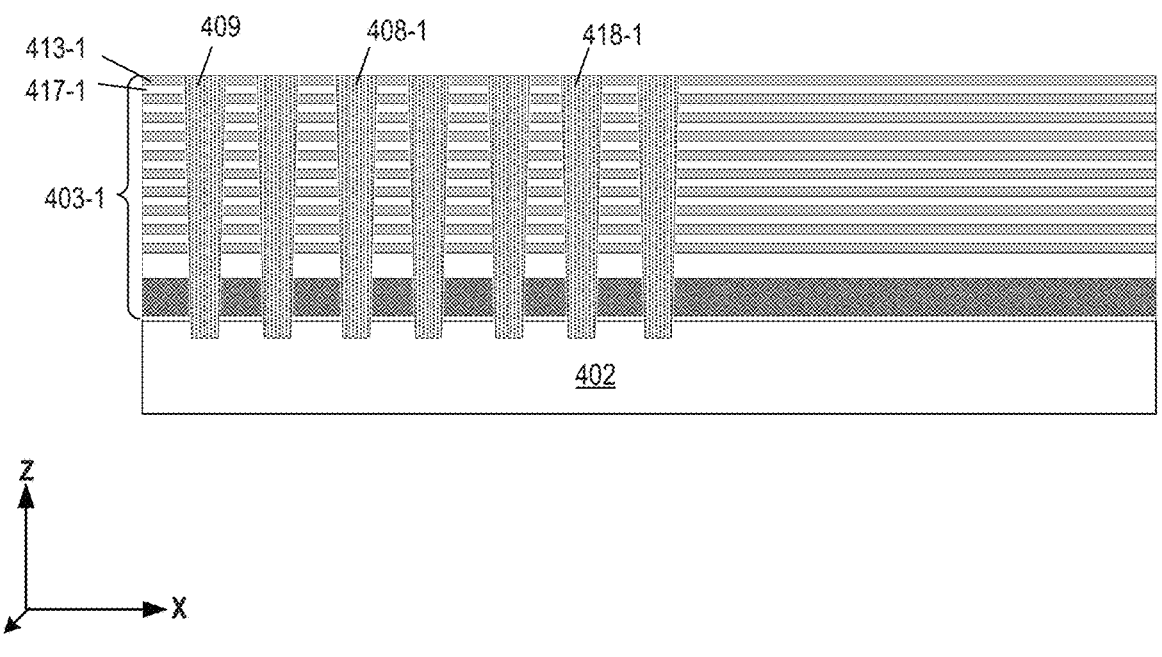

Referring back to FIG. 6, after the formation of the first channel hole portions, the first support hole portions, and other first support hole portions, method 600 proceeds to operation 604, in which a plurality of channel sacrificial portions and a plurality of first support portions are formed. Optionally, at least one other first support portion is formed. FIG. 4B illustrates a corresponding structure.

As shown in FIG. 4B, a plurality of channel sacrificial portions 409 are formed in first channel hole portions 405-1, and a plurality of first support portions 408-1 are formed in first support hole portions 407-1. Optionally, at least one other first support portion 418-1 is formed in the at least one first support hole portion 415-1. FIG. 4B illustrates a corresponding structure.

A first material, having desired stiffness and mechanical strength, can be deposited using the same deposition method to fill up first channel hole portions 405-1 and first support hole portions 407-1, and other first support hole portions 415-1, if any. The first material may be chosen to have a different etch selectivity than first sacrificial material layers 413-1 and first dielectric material layers 417-1. For example, an etchant may selectively etch the first material over first sacrificial material layers 413-1 and first dielectric material layer 417-1. In some embodiments, the first material is different from the materials of first sacrificial material layers 413-1 and first dielectric material layer 417-1. The first material may function as a sacrificial material for forming channel structures. In some embodiments, the first material includes polysilicon. The first material may be deposited using a suitable deposition method, e.g., CVD, PVD, ALD, or a combination thereof. Optionally, a planarization process, e.g., recess etch and/or chemical mechanical polishing (CMP), can be performed to remove any excess materials on first dielectric stack portion 403-1, after the first material is deposited. In various embodiments, depending on the design of the 3D memory device, different materials can be respectively deposited into first channel hole portions 405-1 and first support hole portions 407-1 (and other first support hole portions 415-1, if any). Separate deposition methods may be employed accordingly.

Figure 4C:
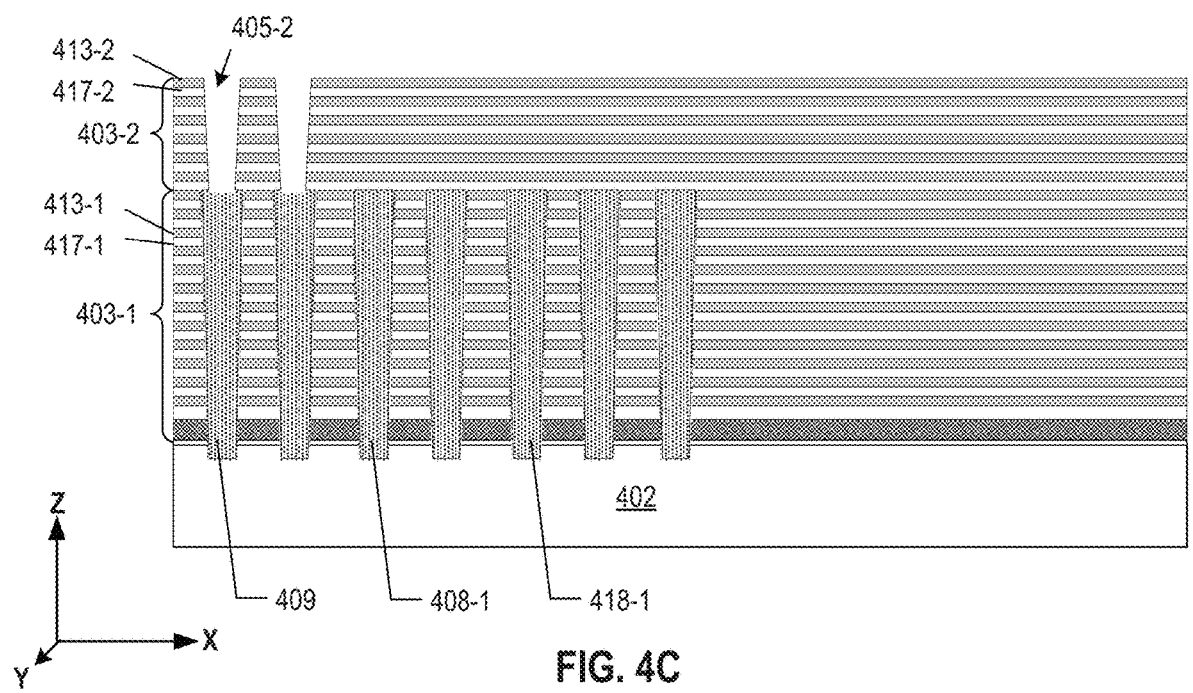

Referring back to FIG. 6, after the formation of channel sacrificial portions and first support portions, method 600 proceeds to operation 606, in which a second dielectric stack portion is formed over the first dielectric stack portion. FIG. 4C illustrates a corresponding structure.

As shown in FIG. 4C, a second dielectric stack portion 403-2 is formed over first dielectric stack portion 403-1. Second dielectric stack portion 403-2 may cover channel sacrificial portions 409 and first support portions 408-1, and the at least one other first support portions 418-1, if any. Second dielectric stack portion 403-2 may include interleaved a plurality of second sacrificial material layers 413-2 and a plurality of second dielectric material layers 417-2 stacking on first dielectric stack portion 403-1. The formation and materials of second dielectric stack portion 403-2 may be similar to those of first dielectric stack portion 403-1, and the detailed description is not repeated herein. As will be shown in FIG. 4D, first and second dielectric stack portions 403-1 and 403-2 may form a dielectric stack 403, first and second sacrificial material layers 413-1 and 413-2 may together be referred to as sacrificial material layers 413, and first and second dielectric material layers 417-1 and 417-2 may together be referred to as dielectric material layers 417.

Figure 4D:
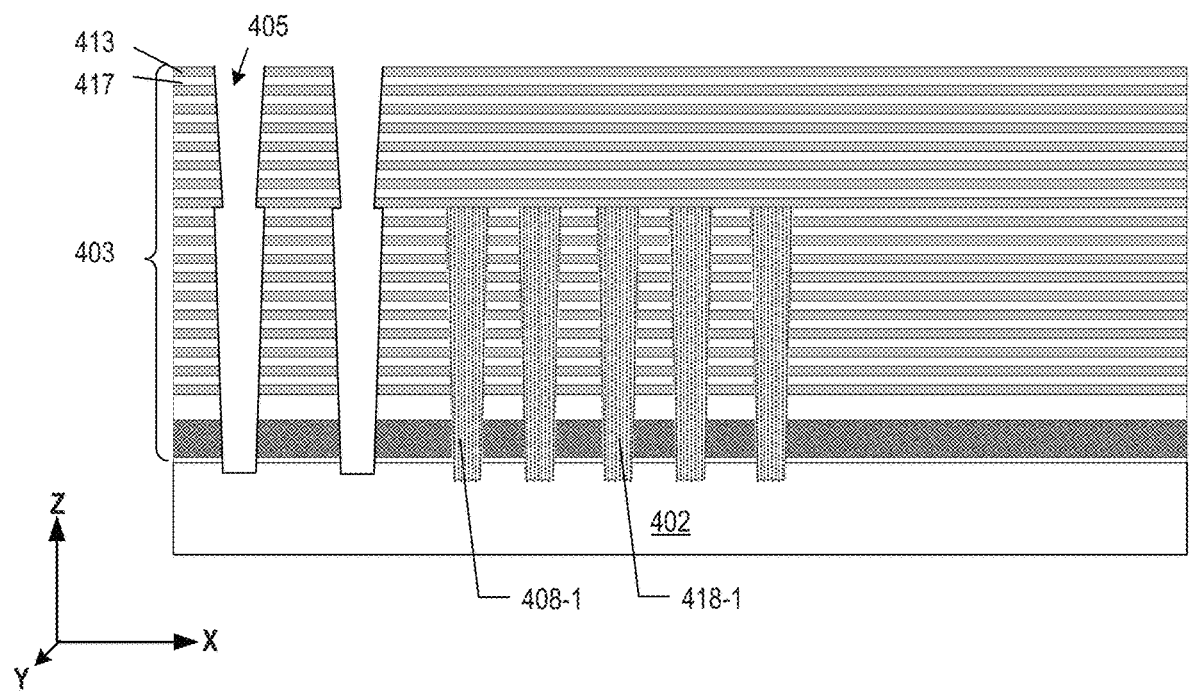

Referring back to FIG. 6, after the formation of second dielectric stack portion, method 600 proceeds to operation 608, in which a plurality of second channel hole portions are formed to form a plurality of channel holes. FIG. 4D illustrates a corresponding structure.

As shown in FIG. 4D, a plurality of second channel hole portions, each corresponding to and aligned with a respective channel sacrificial portion 409, are formed in second dielectric stack portion 403-2. Each second channel hole portion may be in contact with the respective channel sacrificial portion 409 such that the upper surface of each channel sacrificial portion 409 is exposed by the respective second channel hole portion. A suitable etching process may be performed to remove channel sacrificial portions 409 through the second channel hole portions. First channel hole portions 405-1 (and any recess region at the bottom of each first channel hole portion 405-1) may be exposed and in contact with the respective second channel hole portions. A channel hole 405 may be formed by the connection of each first channel hole portion 405-1 and the respective second channel hole portion. In some embodiments, substrate 402 is exposed at the bottom of channel hole 405.

A suitable etching process, e.g., a dry etch and/or a wet etch, can be performed to remove the deposited first material in the first channel hole portions. First support portions 408-1 and other first support portions 418-1, if any, may be retained in dielectric stack 403.

Figure 4E:
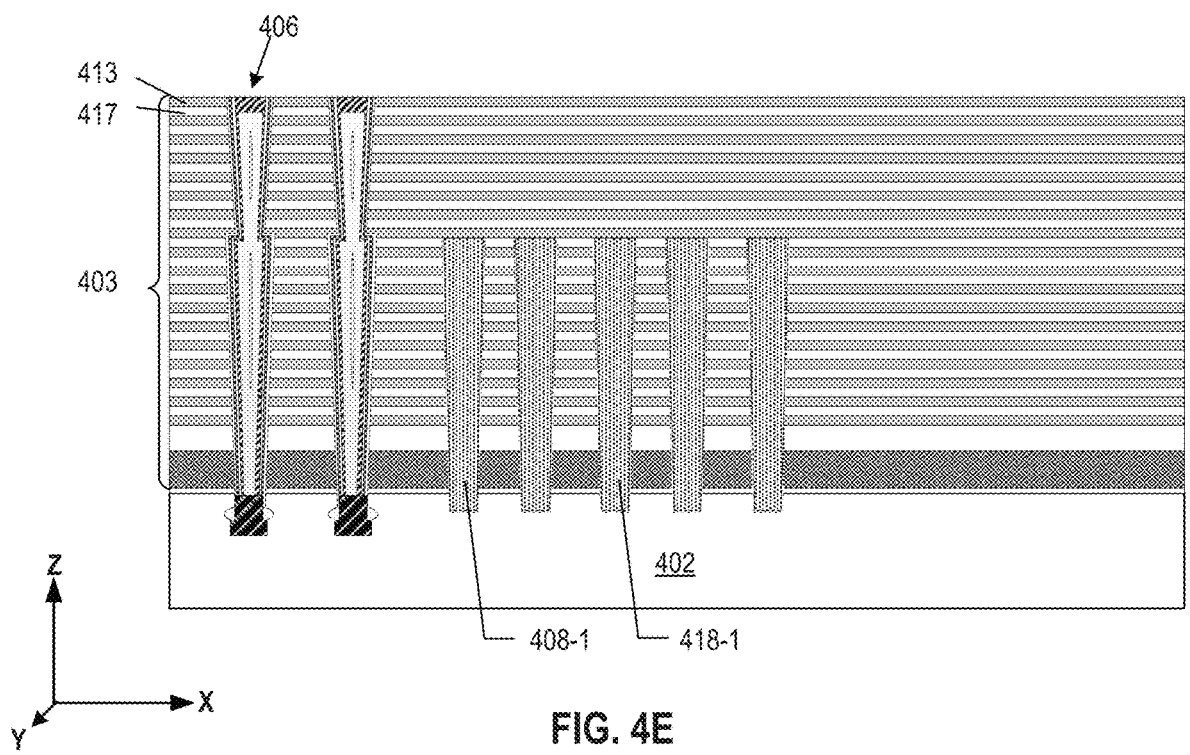

Referring back to FIG. 6, after the formation of channel holes, method 600 proceeds to operation 610, in which a plurality of channel structures are formed in the channel holes. FIG. 4E illustrates a corresponding structure.

As shown in FIG. 4E, a plurality of channel structures 406 can be formed in channel holes 405. Channel structures 406 may extend in dielectric stack 403 along the vertical direction (e.g., the z-direction) and may have a memory film and a semiconductor layer. The memory film may include a blocking layer, a memory layer, and a tunneling layer. In some embodiments, channel structure 406 includes a dielectric core. The blocking layer, the memory layer, the tunneling layer, the semiconductor layer, and the dielectric core (if any) may arrange inwardly from the sidewall towards the center of channel structure 406. In some embodiments, a semiconductor plug is formed at the bottom of each channel structure 406, e.g., in the recess region. In some embodiments, a drain structure is formed in the upper portion of each channel structure 406. The semiconductor layer may be in contact with and conductively connected to the semiconductor plug and the drain structure.

The semiconductor plug may be formed by an epitaxial growth process and/or a deposition process in channel hole 405. In some embodiments, memory film is first deposited to cover the sidewall of the channel hole and the top surface of the epitaxial portion. The blocking layer, memory layer, and tunneling layer can be subsequently deposited in this order using one or more thin film deposition processes, such as ALD, CVD, PVD, any other suitable processes, or any combination thereof, to form memory film. A semiconductor layer may then be deposited over the memory film and above the epitaxial portion. The semiconductor layer can then be deposited on the tunneling layer using one or more thin film deposition processes, such as ALD, CVD, PVD, any other suitable processes, or any combination thereof. In some embodiments, a dielectric core is filled in the remaining space of the channel hole by depositing dielectric materials after the deposition of the semiconductor layer. In some embodiments, parts of the memory film, semiconductor layer, and dielectric core on the top surface of dielectric stack 403 and in the upper portion of each channel hole 405 can be removed by CMP, grinding, wet etching, and/or dry etching to form a recess in the upper portion of the channel hole. Drain structure then can be formed by depositing conductive materials, such as metals, into the recess by one or more thin film deposition processes, such as CVD, PVD, ALD, electroplating, electroless plating, or any combination thereof. A channel structure 406 is thereby formed. Optionally, a planarization process, e.g., dry/wet etch and/or CMP, is performed to remove any excess material on the upper surface of dielectric stack 403.

Figure 4F:
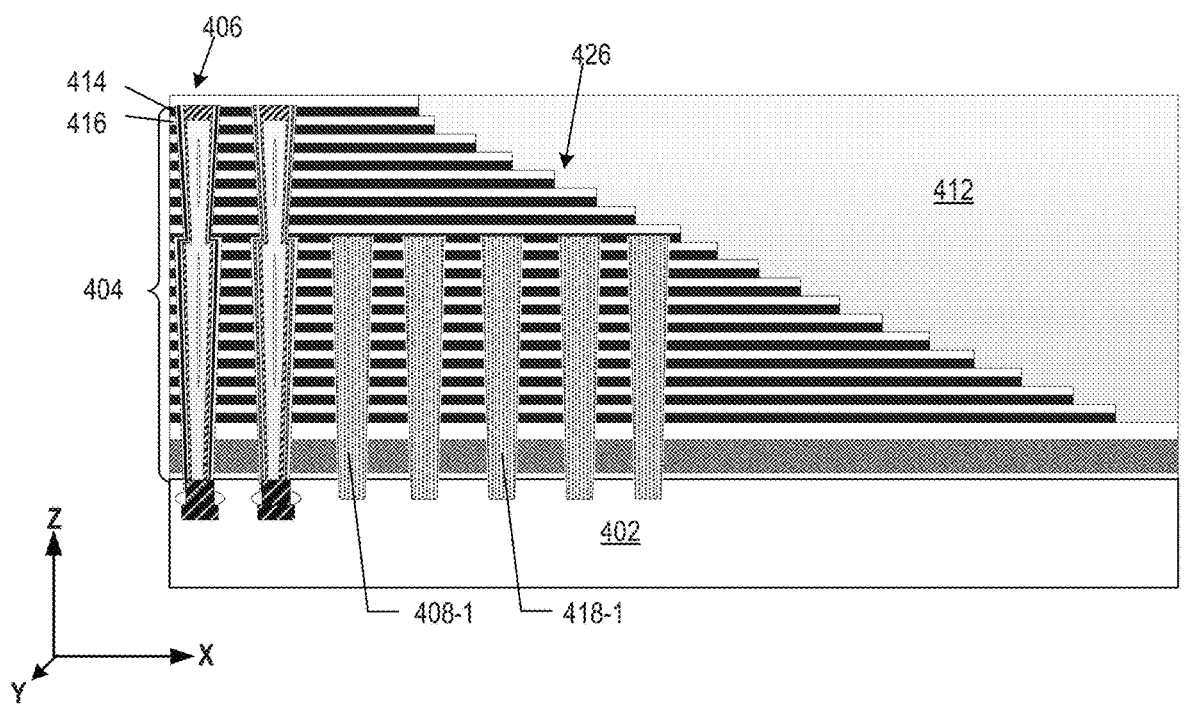

Referring back to FIG. 6, after the formation of the channel structures, method 600 proceeds to operation 612, in which a staircase structure is formed, and a plurality of conductor layers are formed. FIG. 4F illustrates a corresponding structure.

As shown in FIG. 4F, a staircase structure is formed in the staircase region of the 3D memory device. The staircase structure may include a plurality of stairs 426. As previously described, the upper surfaces of stairs 426 may be above any other first support portions 418-1. The staircase structure can be formed by repetitively patterning dielectric stack 403, which includes the plurality of dielectric pairs formed by interleaved sacrificial material layers 413 and dielectric material layers 417, using an etch mask, e.g., a patterned PR layer over dielectric stack 403. In some embodiments, one or more dielectric pairs can form one level/staircase. During the formation of the staircase structure, the PR layer is trimmed (e.g., etched incrementally and inwardly from the boundary of the dielectric stack 403, often from all directions) and used as the etch mask for etching the exposed portion of dielectric stack 403. The amount of trimmed PR can be directly related (e.g., determinant) to the dimensions of the staircases. The trimming of the PR layer can be obtained using a suitable etch, e.g., an isotropic dry etch and/or a wet etch. One or more PR layers can be formed and trimmed consecutively for the formation of the staircase structure. Each dielectric pair can be etched, after the trimming of the PR layer, using suitable etchants to remove a portion of both dielectric material layer 417 and the underlying sacrificial material layer 413. The etching of dielectric stack 403 may include a suitable dry etch and/or wet etch. The etched sacrificial material layers 413 and dielectric material layers 417 may form a plurality of sacrificial layers and dielectric layers 416. The PR layer can then be removed.

A slit structure (not shown) may be formed extending in dielectric stack 403 and in contact with substrate 402. The slit structure may be formed by removing a portion of dielectric stack 403 using a suitable etching process, e.g., dry etch and/or wet etch. The sacrificial layers may be removed through the slit structure to form a plurality of lateral recesses, using an isotropic etching process, e.g., wet etch. A conductor material may then be deposited to fill up the lateral recesses, forming the plurality of conductor layers 414 in the lateral recesses. Accordingly, as shown in FIG. 4F, a memory stack 404, having interleaved a plurality of conductor layers 414 and dielectric layers 416, may be formed. The deposition of the conductor material may include any suitable deposition methods such as CVD, PVD, ALD, or a combination thereof. An insulating structure 412 may be formed over memory stack 404 such that memory stack 404 is located in insulating structure 412. Insulating structure 412 may be formed by depositing a dielectric material, e.g., silicon oxide, over memory stack using a suitable deposition method such as CVD, PVD, ALD, or a combination thereof.

Figure 4G:
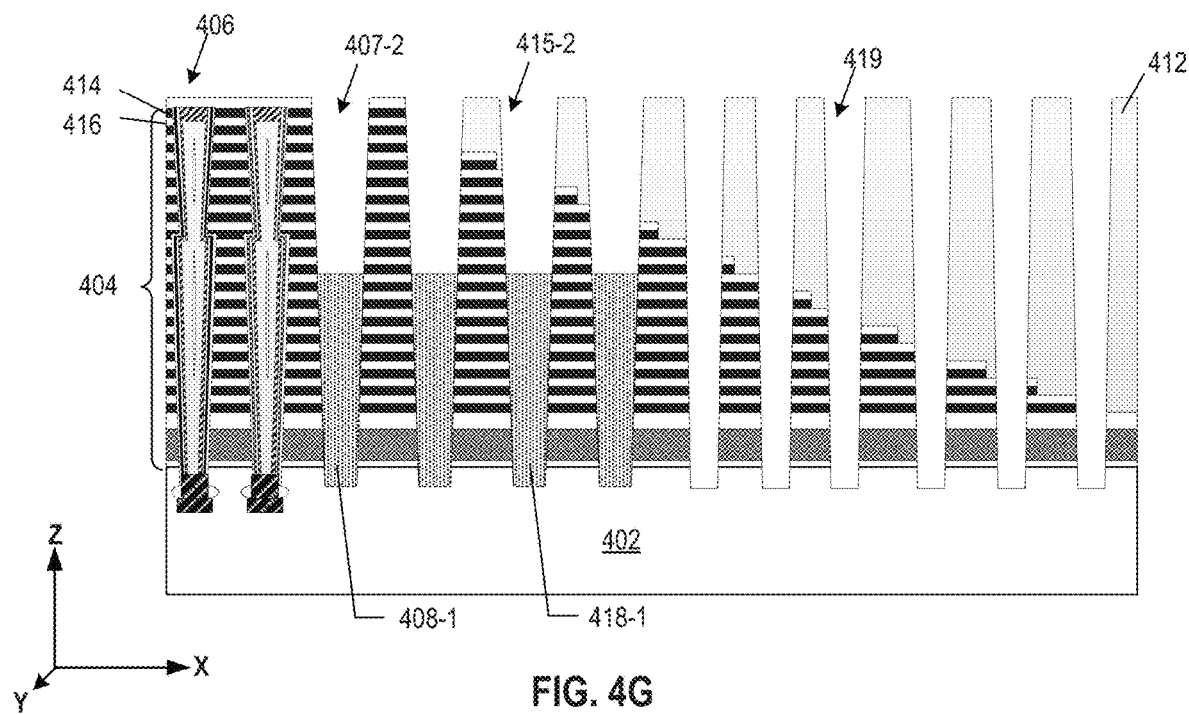

Referring back to FIG. 6, after the formation of staircase structure and conductor layers, method 600 proceeds to operation 614, in which a plurality of second support hole portions and a plurality of third support holes are formed. Optionally, at least one other second support hole portion is formed. FIG. 4G illustrates a corresponding structure.

As shown in FIG. 4G, a plurality of second support hole portions 407-2 and a plurality of third support holes 419 are formed. Optionally, at least one other second support hole portion 415-2 is formed. Each second support hole portion 407-2 may align with (e.g., along the vertical direction) and in contact with a respective first support portion 408-1. In some embodiments, second support hole portions 407-2 are in contact with the respective first support portion 408-1 at an upper surface of first support portion 408-1. Third support holes 419 may be formed in the staircase region, extending in the staircase structure and insulating structure 412. In various embodiments, third support holes 419 may or may not be in contact with substrate 402. In some embodiments, the bottom surfaces of third support holes 419 are below the upper surface of substrate 402. If at least one other first support portion 418-1 is formed, the at least one other second support hole portion 415-2 may be formed. Other second support hole portion 415-2 may each align with (e.g., along the vertical direction) and in contact with a respective other first support portion 418-1. In some embodiments, other second support hole portion 415-2 is in contact with the respective other first support portion 418-1 at an upper surface of other first support portion 418-1. In some embodiments, other second support hole portions 415-2 may be located between third support holes 419 and second support hole portions 407-2.

The same etching process, e.g., dry etch and/or wet etch, may be performed to form second support hole portions 407-2 and third support holes 419, and other second support hole portions 415-2 (if any). The etchant may have a higher etch rate on conductor layers 414, dielectric layers 416, and insulating structure 412 over first support portions 408-1 and other first support portions 418-1 (if any). That is, the etchant may selectively etch the materials of conductor layers 414, dielectric layers 416, and insulating structure 412 over the first material. In some embodiments, the upper surfaces of first support portions 408-1 and other first support portions 418-1 (if any) may be coplanar with or lower than the interface between first and second dielectric stack portions 403-1 and 403-2 after the etching process. However, a desired portion of first support portions 408-1 and other first support portions 418-1 (if any) may be maintained. In various embodiments, separate etching processes, e.g., dry etch and/or wet etch, may be performed to form second support hole portions 407-2 and third support holes 419 separately.

Figure 4H:
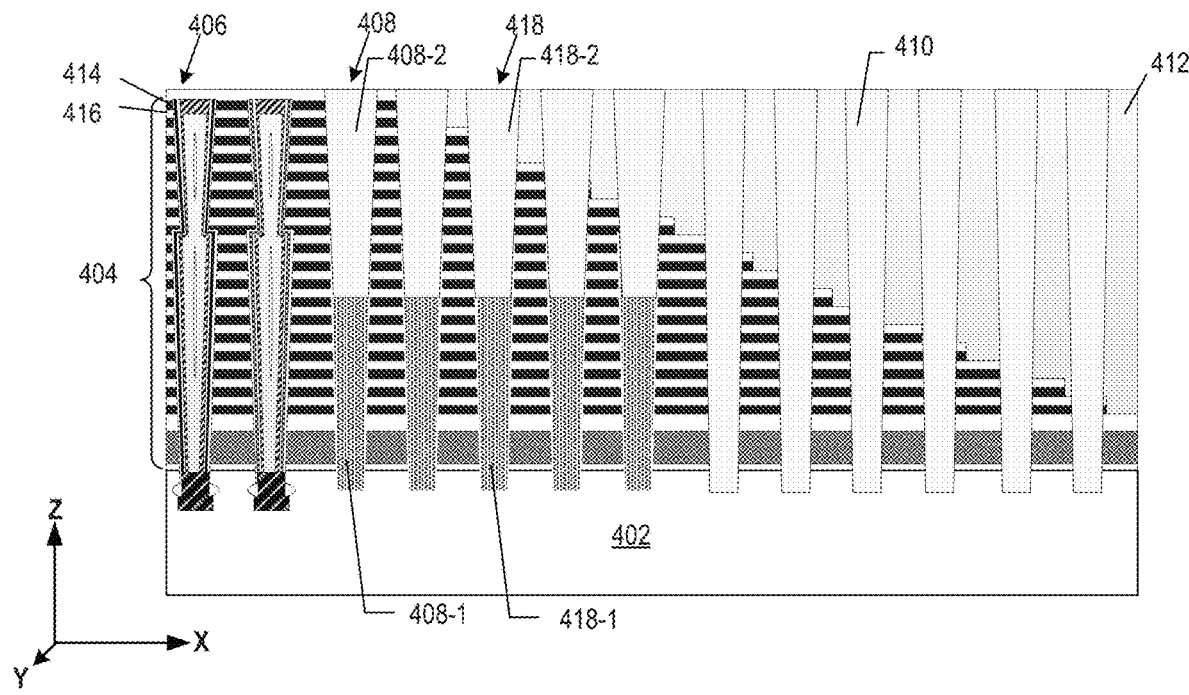

Referring back to FIG. 6, after the formation of second support hole portions and third support holes, method 600 proceeds to operation 616, in which a plurality of second support portions and a plurality of third support structures are formed. Optionally, at least one other second support portion is formed. FIG. 4H illustrates a corresponding structure.

As shown in FIG. 4H, a plurality of second support portions 408-2 may be formed in second support hole portions 407-2, and a plurality of third support structures 410 may be formed in third support holes 419. At least one other second support portion 418-2 may be formed in the at least one other second support hole portion 415-2, if any. The same deposition method, e.g., CVD, PVD, ALD, or a combination thereof, may be performed to deposit a second material to fill second support hole portions 407-2, third support holes 419, and other second support hole portion 415-2, if any. In some embodiments, the second material includes silicon oxide. Optionally, a planarization process, CMP and/or recess etch, may be performed to remove any recess material over memory stack 404 after the deposition process. Second support portions 408-2, third support structures 410, and other second support portions 418-2 if any), may be formed.

As shown in FIG. 4H, a plurality of first support structures 408, each having first support portion 408-1 and second support portion 408-2, may be formed. Second support structures 418 (if any), each having other first support portion 408-1 and other second support portion 408-2, may be formed.

Figure 5A:
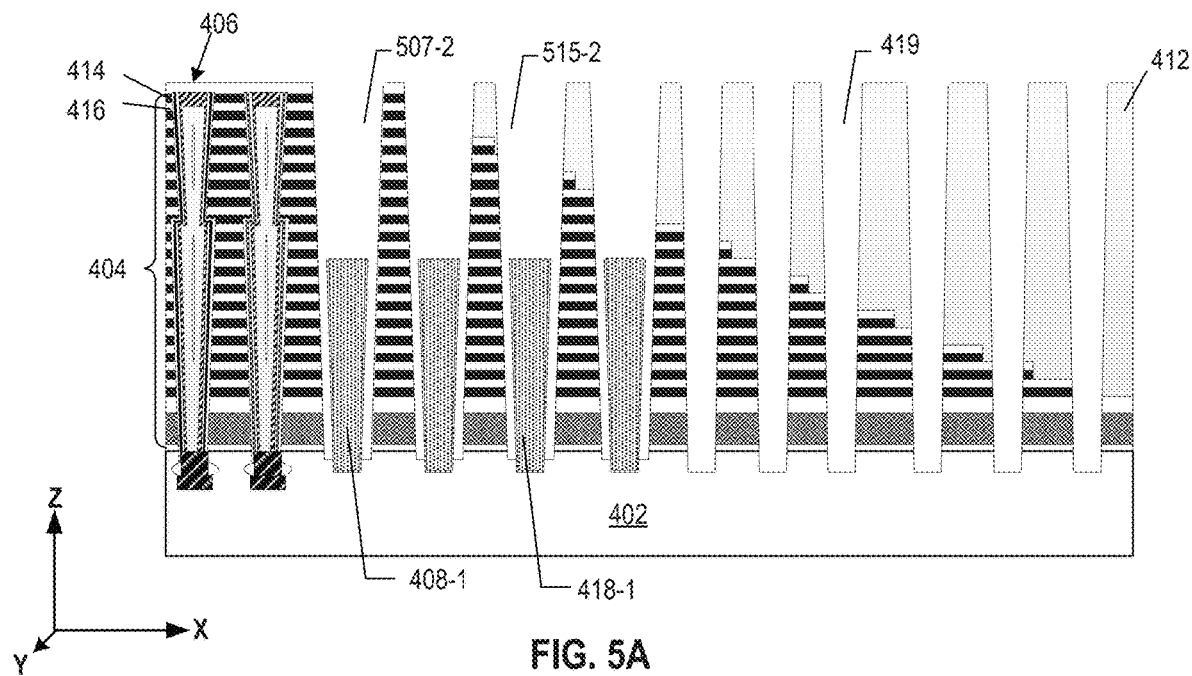
FIGS. 5A and 5B illustrate cross-sectional views of a 3D memory device at various stages of another exemplary fabrication process, according to some embodiments of the present disclosure.
Figure 5B:
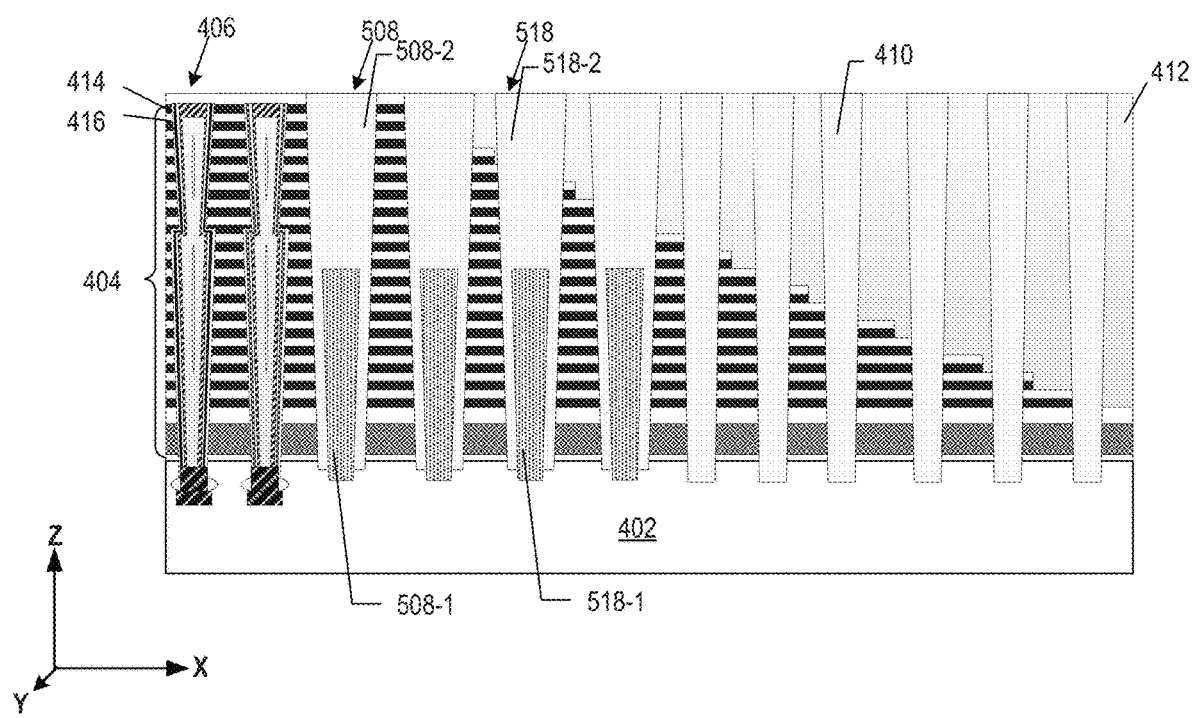

FIGS. 5A and 5B illustrate a cross-sectional view of another 3D memory device formed using method 600, according to some embodiments. The 3D memory device may be similar to 3D memory device 300. The fabrication process in FIGS. 5A and 5B may be performed after operation 612.

Referring back to FIG. 6, after the formation of staircase structure and conductor layers, method 600 proceeds to operation 614, in which a plurality of second support hole portions and a plurality of third support holes are formed. Optionally, at least one other second support hole portion is formed. FIG. 5A illustrates a corresponding structure.

As shown in FIG. 5A, a plurality of second support hole portions 507-2 and a plurality of third support holes 419 are formed. Optionally, at least one other second support hole portion 515-2 is formed. Each second support hole portion 507-2 may align with (e.g., along the vertical direction) and in contact with a respective first support portion 408-1. In some embodiments, second support hole portion 407-2 is in contact with the respective first support portion 408-1 at an upper surface and a side surface of first support portion 408-1. For example, in addition to being in contact with first support portion 408-1 at the upper surface, second support hole portion 507-2 may surround first support portion 408-1 laterally (e.g., along various/all directions in the x-y plane). The bottom surface of second support hole portion 507-2 may be below the upper surface of the respective first support portion 408-1. In various embodiments, the bottom surface of second support hole portion 507-2 may or may not be in contact with substrate 402. In some embodiments, the bottom surface of second support hole portion 507-2 may be below the upper surface of substrate 402 and may or may not be coplanar with the bottom surface of the respective first support portion 408-1. In some embodiments, the lateral dimensions of each second support hole portion 507-2 may be greater than the lateral dimensions of the respective first support portion 408-1 so that sufficient space can be formed between the side surfaces of second support hole portion 507-2 and the respective first support portion 408-1, allowing a desirable amount of second material to be filled in.

In some embodiments, other second support hole portion 515-2, if any, may have similar or the same structure as second support hole portion 507-2. For example, in addition to being in contact with the respective other first support portion 418-1 at the upper surface, other second support hole portion 515-2 may surround other first support portion 418-1 laterally (e.g., along various directions in the x-y plane). The detailed description can be referred to the description of second support hole portion 507-2 and is not repeated herein.

The same etching process, e.g., dry etch and/or wet etch, may be performed to form second support hole portions 507-2 and third support holes 419, and other second support hole portions 515-2 (if any). The etching process may be similar to the etching process to form second support hole portion 407-2, and the detailed description is not repeated herein.

Referring back to FIG. 6, after the formation of second support hole portions and third support holes, method 600 proceeds to operation 616, in which a plurality of second support portions and a plurality of third support structures are formed. Optionally, at least one other second support portion is formed. FIG. 5B illustrates a corresponding structure.

As shown in FIG. 5B, a plurality of second support portions 508-2 may be formed in second support hole portions 507-2 and a plurality of third support structures 410 may be formed in third support holes 419. Optionally, at least one other second support portion 518-2 is formed in the at least one other second support hole portion 515-2, if any. The same deposition process, e.g., CVD, PVD, ALD, or a combination thereof, may be performed to fill second support hole portions 507-2, third support holes 419, and the at least one other second support hole portion 515-2, if any, to form second support portions 508-2, third support structures 410, and other second support portions 518-2 (if any). The detailed description of the deposition process may be referred to the same description of the second support portion 408-2 and thus, is not repeated.

A source contact structure may be formed in the slit structure at any suitable stage during the fabrication process after conductor layers 414 are formed. A doped region may be formed in substrate 402 at the bottom of the slit structure by a suitable doping method, e.g., ion implantation. A dielectric spacer (e.g., silicon oxide) and a source contact (e.g., W) in the dielectric spacer may be formed in the slit structure, each by a suitable deposition process, such as CVD, PVD, ALD, or a combination thereof.

It should be noted that, in various embodiments, support structures having the disclosed structures are formed in the staircase structure, the formation of such support structure in the transitional region is optional. For example, in some embodiments, no support structure is formed in the transitional region using the disclosed methods and structures. The formation of the support structures in the staircase structure, without the formation of the support structures in the transitional region, can be referred to the fabrication method illustrated in FIGS. 4A-4H and 5A and 5B and the detailed description is not repeated herein. The locations of the support structures should not be limited by the embodiments of the present disclosure.

It should also be noted that, the numbers and distribution of channel structures in the core region, and support structures in the transitional region and staircase region are for illustrating the structures and methods of the present disclosure only, and are not intended to represent the actual numbers of these structures. The numbers and distribution of these structures should be determined based on the design of the 3D memory device and should not be limited by the embodiments of the present disclosure.

Embodiments of the present disclosure provide a 3D memory device, which includes a memory stack and a support structure. The memory stack, on a substrate, includes a core region and a non-core region neighboring the core region. The support structure extends in the non-core region and into the substrate. The support structure includes a first support portion and a second support portion over the first support portion. The first support portion has a stiffness higher than the second support portion.

In some embodiments, the first support portion includes polysilicon, and the second support portion includes silicon oxide.

In some embodiments, the first support portion is located at a lower portion of the support structure, and the second support portion is located at an upper portion of the support structure. The second support portion of the support structure is on the first support portion of the support structure.

In some embodiments, the first support portion is located at a lower portion of the support structure, and the second support portion is located at an upper portion and the lower portion of the support structure; and the second support portion is on and laterally surrounds the first support portion of the support structure.

In some embodiments, the non-core region includes a staircase region neighboring the core region and a transitional region between the core region and the staircase region.

In some embodiments, the support structure is located in the transitional region.

In some embodiments, the memory device further includes, in the staircase region, a second support structure extending in a staircase structure and an insulating structure over the staircase structure. The second support structure includes a first support portion and a second support portion over the first support portion, the first support portion having a stiffness higher than the second support portion.

In some embodiments, the first support portion of the second support structure includes polysilicon, and the second support portion of the second support structure includes silicon oxide.

In some embodiments, the first support portion is located at a lower portion of the second support structure, and the second support portion is located at an upper portion of the second support structure. In some embodiments the second support portion is on the first support portion of the second support structure.

In some embodiments, the first support portion is located at a lower portion of the second support structure, and the second support portion is located at an upper portion and the lower portion of the second support structure. In some embodiments, the second support portion of the second support structure is on and laterally surrounds the first support portion of the second support structure.

In some embodiments, the support structure is located in a staircase structure in the staircase region and an insulating structure over the staircase structure.

In some embodiments, the memory device further includes a second support structure extending in the transitional region. The second support structure includes a first support portion and a second support portion over the first support portion, the first support portion having a stiffness higher than the second support portion.

In some embodiments, the first support portion of the second support structure comprises polysilicon, and the second support portion of the second support structure includes silicon oxide.

In some embodiments, the first support portion of the second support structure is located at a lower portion, and the second support portion of the second support structure is located at an upper portion; and the second support portion of the second support structure is on the first support portion of the second support structure.

In some embodiments, the first support portion of the second support structure is located at a lower portion, and the second support portion of the second support structure is located at an upper portion and the lower portion; and the second support portion of the second support structure is on and laterally surrounds the first support portion of the second support structure.

In some embodiments, the 3D memory device further includes a third support structure extending in the staircase structure the insulating structure over the staircase. The third support structure includes a same material as the second support portion of the second support structure.

In some embodiments, the memory stack further includes interleaved a plurality of conductor layers and a plurality of dielectric layers on the substrate. In some embodiments, the memory device further includes a channel structure in the core region extending in the conductor layers and dielectric layers into the substrate. The channel structure includes a semiconductor channel that forms a plurality of memory cells with the conductor layers.

Embodiments of the present disclosure provide a method for forming a 3D memory device. The method includes forming, in a first dielectric stack portion over a substrate, a channel sacrificial portion in a core region of the first dielectric stack portion and a first support portion in a non-core region of the first dielectric stack portion. The method also includes forming a second dielectric stack portion over the first dielectric stack portion and removing the channel sacrificial portion. The method further includes forming a channel structure in the first and second dielectric stack portions at a location of the channel sacrificial portion and forming a second support portion over the first support portion to form a support structure.

In some embodiments, forming the first and second support portions includes forming the first support portion using a first material and the second support portion using a second material. The first material has a higher stiffness than the second material.

In some embodiments, forming the first dielectric stack portion includes forming interleaved a first plurality of dielectric layers and a first plurality of sacrificial layers over the substrate.

In some embodiments, forming the channel sacrificial portion and the first support portion include forming, in a same patterning process, a channel hole portion in the core region and a first support hole portion in the non-core region of the first dielectric stack portion.

In some embodiments, forming the channel sacrificial portion and the first support portion include depositing, in a same deposition process, the first material to fill in the channel hole portion and the first support hole portion.

In some embodiments, forming second dielectric stack portion includes forming interleaved a second plurality of dielectric layers and a second plurality of sacrificial layers over the first dielectric stack portion and covering the channel sacrificial portion and the first support portion.

In some embodiments, forming the channel structure includes forming, in the second dielectric stack portion, a second channel hole portion over and in contact with the channel sacrificial portion. In some embodiments, forming the channel structure also includes removing the channel sacrificial portion through the second channel hole portion to expose the substrate and form a channel hole. In some embodiments, forming the channel structure further includes depositing a memory film and a semiconductor layer to at least partially fill the channel hole.

In some embodiments, forming the second support portion includes removing a portion of the second dielectric stack portion to form a second support hole portion in contact with the first support portion at a top surface of the first support portion, and depositing the second material to fill the second support hole portion.

In some embodiments, forming the second support portion includes removing a portion of the second dielectric stack portion to form a second support hole portion in contact with the first support portion at a top surface of the first support portion and laterally surrounding the first support portion. In some embodiments, forming the second support portion also includes depositing the second material to fill the second support hole portion.

In some embodiments, the support structure is formed in a transitional region of the non-core region, and the method further includes forming, before a formation of the second support hole portion, a staircase structure in a staircase region of the non-core region, the staircase region being located between the core region and the transitional region.

In some embodiments, the method further includes forming a second support structure in the staircase region. Forming the second support structure includes forming, in a same process that forms the first support portion, another first support portion in the staircase region. Forming the second support structure also includes forming, in a same process that forms the second support hole portion, another second support hole portion in contact with the other first support portion. Forming the second support structure further includes forming, in a same process that forms the second support portion, another second support portion in contact with the other first support portion.

In some embodiments, the support structure is formed in a staircase region of the non-core region.

In some embodiments, the method further includes forming a third support structure in the staircase region after a formation of the staircase structure. Forming the third support structure includes forming, in a same process that forms the second support hole portion, a third support hole extending in the staircase structure into the substrate. Forming the third support structure includes depositing the second material to fill the third support hole.

In some embodiments, the method further includes forming a slit structure extending in the first and second dielectric stack portions, removing the plurality of first dielectric layers to form a plurality of lateral recesses, and depositing a conductor material into the lateral recesses to form a plurality of conductor layers.

Embodiments of the present disclosure provide another method for forming a 3D memory device. The method includes forming a first dielectric stack portion over a substrate, the first dielectric stack portion comprising interleaved a first plurality of dielectric layers and a first plurality of sacrificial layers, and forming, in a same process, a plurality of channel sacrificial portions in a core region, at least one first support portion in a transitional region, and at least one other first support portion in a staircase region, of the first dielectric stack portion. The method also includes forming a second dielectric stack portion over the first dielectric stack portion, the second dielectric stack portion having interleaved a second plurality of dielectric layers and a second plurality of sacrificial layers covering the plurality of channel sacrificial portions, the at least one first support portion, and at least one other first support portion. The method further includes forming a plurality of channel structures in the first and second dielectric stack portions from the plurality of channel sacrificial portions, and forming, in a same process, at least one second support portion over the first support portions and at least one other second support portion over the at least one other first support portion.

In some embodiments, forming the first and second support portions and the at least one other first and second support portions include forming, respectively, the first support portion and the at least one other first support portion using a first material, and the second support portions and at least one other second support portion using a second material. The first material has a higher stiffness than the second material.

In some embodiments, forming the plurality of channel sacrificial portions, the plurality of first support portions, and the at least one other first support portion include forming, in a same patterning process, a plurality of channel hole portions, at least one first support hole portion, and at least one other first support hole portion, respectively.

In some embodiments, forming the plurality of channel sacrificial portions, the at least one first support portion, and the at least one other first support portion include depositing, in a same deposition process, the first material to fill in the plurality of channel hole portions, the at least one first support hole portion, and the at least one other first support hole portion.

In some embodiments, forming the plurality of channel structures includes forming, in the second dielectric stack portion, at least one second channel hole portion over and in contact with the plurality of channel sacrificial portions. In some embodiments, forming the plurality of channel structures includes removing the plurality of channel sacrificial portions through the at least one second channel hole portion to expose the substrate and form a plurality of channel holes. In some embodiments, forming the plurality of channel structures includes depositing a memory film and a semiconductor layer to at least partially fill each of the channel holes.

In some embodiments, forming the at least one second support portion and the at least one other second support portion include removing, in a same process, at least one portion of the second dielectric stack portion to form, respectively, at least one second support hole portion each in contact with a respective one of the first support portions at a top surface of the first support portion and at least one other second support hole portion in contact with the at least one other first support portion at a top surface of the other first support portion. In some embodiments, forming the at least one second support portion and the at least one other second support portion also include depositing the second material to fill the at least one second support hole portions and the at least one other second support hole portion.

In some embodiments, forming the at least one second support portion and the at least one other second support portion include removing, in a same process, a plurality of portions of the second dielectric stack portion to form, respectively, (i) at least one second support hole portion each in contact with a respective one of the first support portions at a top surface of the first support portion and laterally surrounding the first support portion, and (ii) at least one other second support hole portion in contact with the at least one other first support portion at a top surface of the other first support portion and laterally surrounding the other first support portion. In some embodiments, forming the at least one second support portion and the at least one other second support portion also include depositing the second material to fill the at least one second support hole portion and the at least one other second support hole portion.

In some embodiments, the method further includes forming a staircase structure, before a formation of the at least one second support hole portion and the at least one other second support hole portion, a staircase region neighboring the transitional region.

In some embodiments, the method further includes forming a plurality of third support structures in the staircase region after a formation of the staircase structure. Forming the plurality of third support structures includes forming, in a same process that forms the plurality of second support hole portions, a plurality of third support holes extending in the staircase structure into the substrate. In some embodiments, the method also includes depositing the second material to fill the plurality of third support holes.

In some embodiments, the method further includes forming a slit structure extending in the first and second dielectric stack portions, removing the plurality of first dielectric layers to form a plurality of lateral recesses, and depositing a conductor material into the lateral recesses to form a plurality of conductor layers.

The foregoing description of the specific embodiments can be readily modified and/or adapted for various applications. Therefore, such adaptations and modifications are intended to be within the meaning and range of equivalents of the disclosed embodiments, based on the teaching and guidance presented herein.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
a memory stack comprising a plurality of conductor/dielectric layer pairs, on a substrate, comprising a core region and a non-core region neighboring the core region; and
a support structure extending through the memory stack in the non-core region and into the substrate, wherein
the support structure comprises a first support portion and a second support portion over the first support portion, the first support portion having a stiffness higher than the second support portion, the first support portion penetrating a low subset of the conductor/dielectric layer pairs and being in contact with the substrate, and the second support portion penetrating an upper subset of the conductor/dielectric layer pairs and being in contact with a top surface of the first support portion;
the first support portion is located at a lower portion of the support structure, and the second support portion is located at an upper portion and the lower portion of the support structure; and
the second support portion of the support structure is on and laterally surrounds the first support portion of the support structure.

2. The memory device of claim 1, wherein the first support portion comprises polysilicon and the second support portion comprises silicon oxide.

3. The memory device of claim 1, wherein the non-core region comprises a staircase region neighboring the core region and a transitional region between the core region and the staircase region.

4. The memory device of claim 3, wherein the support structure is located in the transitional region.

5. The memory device of claim 4, further comprising, in the staircase region, a second support structure extending in a staircase structure and an insulating structure over the staircase structure, wherein:

the second support structure comprises a first support portion of the second support structure and a second support portion of the second support structure over the first support portion of the second support structure, the first support portion of the second support structure having a stiffness higher than the second support portion of the second support structure.

6. The memory device of claim 5, wherein the first support portion of the second support structure comprises polysilicon, and the second support portion of the second support structure comprises silicon oxide.

7. The memory device of claim 5, wherein
the first support portion of the second support structure is located at a lower portion of the second support structure, and the second support portion of the second support structure is located at an upper portion of the second support structure; and
the second support portion of the second support structure is on the first support portion of the second support structure.

8. The memory device of claim 5, wherein
the first support portion of the second support structure is located at a lower portion of the second support structure, and the second support portion of the second support structure is located at an upper portion and the lower portion of the second support structure; and
the second support portion of the second support structure is on and laterally surrounds the first support portion of the second support structure.

9. The memory device of claim 3, wherein the support structure is located in a staircase structure in the staircase region and an insulating structure over the staircase structure.

10. The memory device of claim 9, further comprising a second support structure extending in the transitional region, wherein:
the second support structure comprises a first support portion of the second support structure and a second support portion of the second support structure over the first support portion of the second support structure, the first support portion of the second support structure having a stiffness higher than the second support portion of the second support structure; and
the first support portion of the second support structure comprises polysilicon, and the second support portion of the second support structure comprises silicon oxide.

11. A memory device, comprising:
a memory stack comprising a plurality of conductor/dielectric layer pairs, on a substrate; and
at least one support structure each comprising:
a first support portion penetrating a low subset of the conductor/dielectric layer pairs, being in contact with the substrate, and having a first material, and
a second support portion penetrating an upper subset of the conductor/dielectric layer pairs, being in contact with a top surface of the first support portion, and having a second material,
wherein a first stiffness of the first material is higher than a second stiffness of the second material, and the second support portion is in contact with a sidewall of the first support portion.

12. The memory device of claim 11, wherein:
the first support portion extends into the substrate.

13. The memory device of claim 11, wherein:
the second support portion extends into the substrate.

14. The memory device of claim 11, wherein:
a lower portion of the second support portion laterally surrounds an upper portion of the first support portion.

15. The memory device of claim 11, further comprising:
a channel structure in a core region;
wherein the at least one support structure is located in a non-core region.

16. The memory device of claim 15, wherein the at least one support structure comprises:
a first support structure located in a transitional region between the core region and a staircase region; and
a second support structure located in the staircase region.

17. The memory device of claim 16, further comprising:
a third support structure located in the staircase region, wherein the third support structure includes the second material without the first material.

* * * * *